(12) United States Patent
Roohparvar

(10) Patent No.: US 7,269,686 B2
(45) Date of Patent: *Sep. 11, 2007

(54) SYNCHRONOUS MEMORY OPEN PAGE REGISTER

(75) Inventor: Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/302,056

(22) Filed: Dec. 13, 2005

(65) Prior Publication Data
US 2006/0092713 A1    May 4, 2006

Related U.S. Application Data

(63) Continuation of application No. 10/159,141, filed on May 29, 2002, now Pat. No. 7,007,133.

(51) Int. Cl.
*G06F 12/00* (2006.01)
*G11C 7/00* (2006.01)

(52) U.S. Cl. ........................... 711/105; 711/168
(58) Field of Classification Search ............ 711/105, 711/5, 103, 173, 202, 209, 106, 154, 168; 365/233, 226, 189.05
See application file for complete search history.

(56) References Cited

U.S. PATENT DOCUMENTS

| | | | |
|---|---|---|---|
| 5,603,001 A | 2/1997 | Sukegawa et al. | |
| 5,889,714 A | 3/1999 | Schmann et al. | |
| 6,052,756 A | 4/2000 | Barneby et al. | |
| 6,199,138 B1 | 3/2001 | Jeddeloh | |
| 6,219,764 B1 | 4/2001 | Jeddeloh | |
| 6,219,765 B1 * | 4/2001 | Jeddeloh | 711/154 |
| 6,266,734 B1 | 7/2001 | LaBerge | |
| 6,278,654 B1 | 8/2001 | Roohparvar | |
| 6,304,510 B1 | 10/2001 | Nobunaga et al. | |
| 6,307,779 B1 | 10/2001 | Roohparvar | |
| 6,314,049 B1 | 11/2001 | Roohparvar | |
| 6,374,323 B1 | 4/2002 | Stracovsky et al. | |
| 6,377,268 B1 | 4/2002 | Jeddeloh | |
| 6,408,371 B1 | 6/2002 | Jeddeloh | |
| 6,442,076 B1 | 8/2002 | Roohparvar | |
| 6,470,433 B1 | 10/2002 | Prouty et al. | |
| 6,496,440 B2 | 12/2002 | Manning | |
| 6,681,302 B2 | 1/2004 | Cho et al. | |
| 2002/0172081 A1 | 11/2002 | Mukaida et al. | |
| 2003/0018848 A1 | 1/2003 | Ryan | |
| 2003/0031052 A1 | 2/2003 | Roohparvar et al. | |
| 2003/0031076 A1 | 2/2003 | Widmer et al. | |

* cited by examiner

*Primary Examiner*—Pierre-Michel Bataille
(74) *Attorney, Agent, or Firm*—Leffert Jay & Polglaze, P.A.

(57) ABSTRACT

A memory device includes memory cells arranged in multiple blocks. A register is provided to track multiple open pages per block of the memory. In one embodiment, the register is located in the memory device and used to determine if a memory access is to be performed. In another embodiment, the register is located external to the memory and used by a processor and/or chip set to determine if an access request is needed.

32 Claims, 5 Drawing Sheets

SYNCHRONOUS MEMORY OPEN PAGE REGISTER

RELATED APPLICATION

This is a continuation application of U.S. patent application Ser. No. 10/159,141, filed May 29, 2002, titled "SYNCHRONOUS MEMORY OPEN PAGE REGISTER" (now U.S. Pat. No. 7,007,133), which is commonly assigned and the entire contents of which are incorporated herein by reference.

TECHNICAL FIELD OF THE INVENTION

The present invention relates generally to memory devices and in particular the present invention relates to access circuitry of memory devices.

BACKGROUND OF THE INVENTION

Today's synchronous memory devices are used in mobile applications such as personal digital assistants (PDA's) and cell phones for the higher performance they offer. Power consumption of these memory devices, however, is a big issue for battery-powered applications. As such, there is a demand for memory devices that have power saving features.

A synchronous non-volatile memory, such as a synchronous flash memory, is a non-volatile device that performs read operations like a synchronous DRAM device. In general, the synchronous flash memory device has a memory cell array that is arranged in rows and columns. A row is typically accessed and the contents of the data read. The read data can then be randomly read by changing a column address. The read operation consumes power when accessing and sensing the stored data. The row length (number of cells in a row) is a factor of power consumption. As such, the length of an accessed row (page) can be reduced by providing multiple pages per memory bank of a memory device. Excessive power is often consumed, however, by re-accessing a page of the memory was just accessed.

For the reasons stated above, and for other reasons stated below which will become apparent to those skilled in the art upon reading and understanding the present specification, there is a need in the art for a memory device that can reduce power consumption.

SUMMARY OF THE INVENTION

The above-mentioned problems with non-volatile memory devices and other problems are addressed by the present invention and will be understood by reading and studying the following specification.

In one embodiment, a synchronous memory device comprises an array of memory cells arranged in addressable blocks, and a page register to store address locations of multiple pages per addressable block.

In another embodiment, a synchronous memory device comprises an array of memory cells arranged in X addressable blocks, where each of the X addressable blocks are divided into Y page sections. Latch circuitry corresponding to each of X addressable blocks store Y pages of data read from the array. Page register circuitry is provided that comprises X*Y registers to store origination addresses of the Y pages of data per X blocks.

A method of operating a memory device comprises receiving a memory page access request and corresponding page address, comparing the corresponding page address to a contents of a page register, and ignoring the memory page access request if the contents of a page register match the corresponding page address.

A method of operating a flash memory device comprises receiving a memory page access request and corresponding page address from a processor, evaluating a reset bit of a page register, and loading the corresponding page address into the page register, and performing the memory page access if reset bit is set. The corresponding page address is compared to contents of a page register if reset bit is reset, and the memory page access request is ignored if the contents of a page register match the corresponding page address. The corresponding page address is compared to contents of a page register if reset bit is reset. The corresponding page address is loaded into the page register and the memory page access is performed if the contents of a page register do not match the corresponding page address.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention can be embodied in a memory device, a processor system or a chip-set. For purposes of illustration, a flash memory is described herein. The invention, however, is not limited to a specific type of memory. For example, the memory can be volatile (such as SDRAM) or non-volatile (such as flash).

Figure 1:
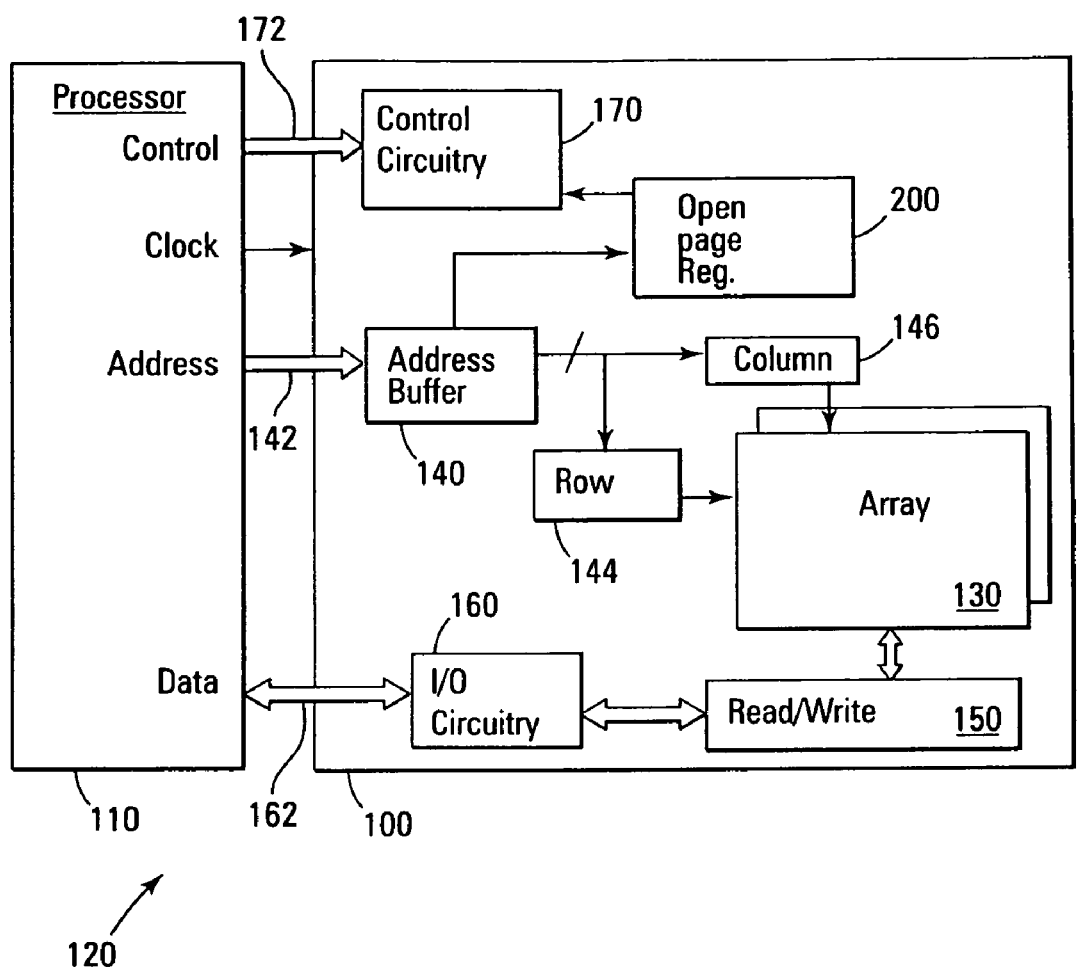
FIG. 1 is a block diagram of a memory device of one embodiment of the present invention.

FIG. 1 is a functional block diagram of a memory device 100 coupled to a processor 110, of one embodiment of the present invention. The memory device 100 and the processor 110 may form part of an electronic system 120. The memory device 100 has been simplified to focus on features of the memory that are helpful in understanding the present invention. The memory device includes an array of memory cells 130. The memory cells are preferably non-volatile floating-gate memory cells and generally have their control gates coupled to word lines, drain regions coupled to local bit lines, and source regions commonly coupled to a ground potential. The memory array 130 is arranged in banks of rows and columns. Each bank is arranged in erase blocks.

During an erase operation, the memory cells of the erase block are placed in an erased state. Data, however, may be stored in the memory array 130 separate from the block structure.

An address buffer circuit 140 is provided to latch address signals provided on address input connections A0-Ax 142. Address signals are received and decoded by row decoder 144 and a column decoder 146 to access the memory array 130. It will be appreciated by those skilled in the art, with the benefit of the present description, that the number of address input connections depend upon the density and architecture of the memory array. That is, the number of addresses increases with both increased memory cell counts and increased bank and block counts.

The non-volatile memory cells are fabricated as floating gate memory cells and include a source region and a drain region that is spaced apart from the source region to form an intermediate channel region. A floating gate, typically made of doped polysilicon, is disposed over the channel region and is electrically isolated from the other cell elements by oxide. For example, gate oxide can be formed between the floating gate and the channel region. A control gate is located over the floating gate and is can also made of doped polysilicon. The control gate is electrically separated from the floating gate by another dielectric layer. Thus, the floating gate is "floating" in dielectric so that it is insulated from both the channel and the control gate.

Program and erase operations are not performed in single steps. That is, successive program pulses are applied to the memory cells to program a memory cell. This approach reduces over-programming. In a similar manner, the erase operation is iterative. In one embodiment, the erase operation includes three primary steps. The first is a pre-program operation in which all of the memory cells of an erase block are programmed. After all of the cells are pre-programmed, successive erase pulses are applied to the memory cells to remove the pre-program charge from the floating gate. A soft-program operation can be performed to 'heal' any over-erased memory cells.

The memory device reads data in the array 130 by sensing voltage changes in the memory array columns using sensing circuitry 150. The sensing circuitry, in one embodiment, is coupled to read and latch a row of data from the memory array. The row data can be one continuous address, or comprised of partial rows of discontinuous addresses.

Data input and output buffer circuitry 160 is included for bi-directional data communication over a plurality of data (DQ) connections 162 with the processor 110. The timing of data communication can vary depending upon the architecture. In one embodiment, data read from the memory can be output on the data connections with read latency. Read latency, as known to those skilled in the art, is the number of clock cycles between a read command and available data on the output connections. In addition, the memory can operate in a burst mode and allows read-while-write capabilities to different array banks.

Command control circuit 170 decodes signals provided on control connections 172 from the processor 110. These signals are used to control the operations on the memory array 130, including data read, data write, and erase operations. During operation, commands are provided on the control connections, such as ACTIVE, READ and WRITE commands. An ACTIVE command is used to open (or activate) a row in a particular array bank for a subsequent access. A selected row generally remains active for accesses until the next ACTIVE command. The READ command is used to initiate a read access to an active row. The address connections are used to select a starting column location. Read data appears on the DQs subject to a read latency value. A WRITE command is used to initiate a single-location write access on an active row. Input data appearing on the DQs is written to the memory array.

The flash memory device has been simplified to facilitate a basic understanding of the features of the memory. A more detailed understanding of internal circuitry and functions of flash memories are known to those skilled in the art. The processor and/or memory of FIG. 1 includes an open page register 200. The open page register, described in greater detail below, reduces access time and power consumption by 'remembering' what data is still available from a prior access.

Figure 2:
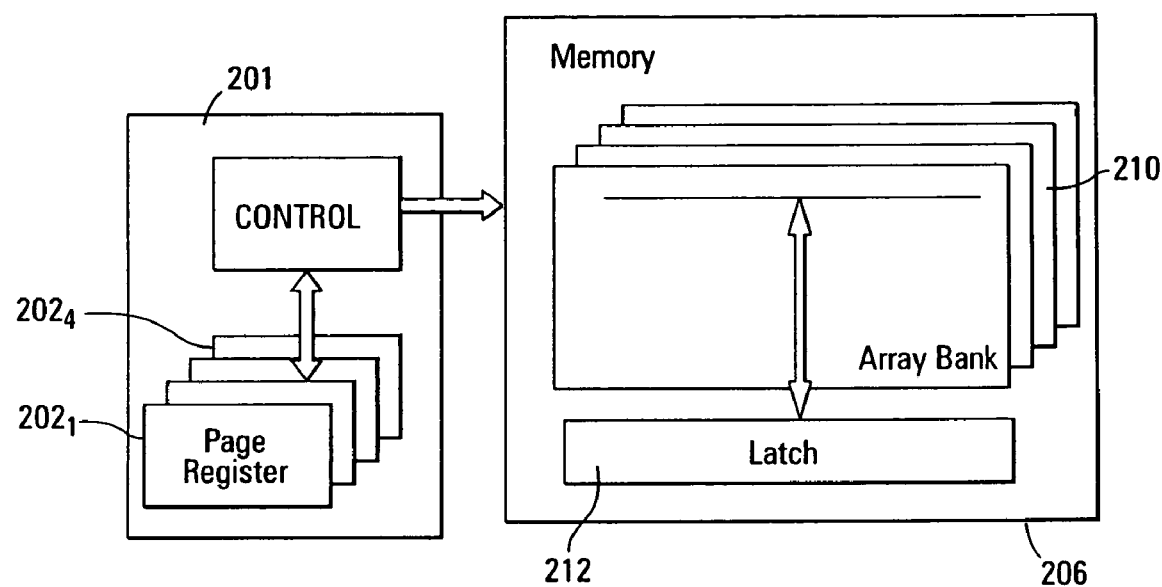
FIG. 2 is a block diagram of a prior art processing system.

FIG. 2 illustrates a prior art DRAM system that includes a page register. The system, or chip set 201, maintains a log of one open page in each of the memory banks. For example, a four bank memory device 206 is coupled to a processor with four registers $202_1$-$202_3$ to track up to four open rows, one in each bank 210. The banks are coupled to corresponding data latches 212 that store data read from the array banks. During operation, the chip set compares the register for an addressed bank to a requested address. If the requested row data is open, the system is not required to re-access the row and can read the data from the latches.

This prior art system works well for memories with a single open page per bank. If memory device has multiple open pages per bank, however, the processor is not capable of tracking each open page. As such, either the system tracks only one of the open pages or the processor register size must be increased. Tracking only a portion of the open pages is inefficient and wastes power by re-opening a previously open page that was not tracked.

Figure 3:
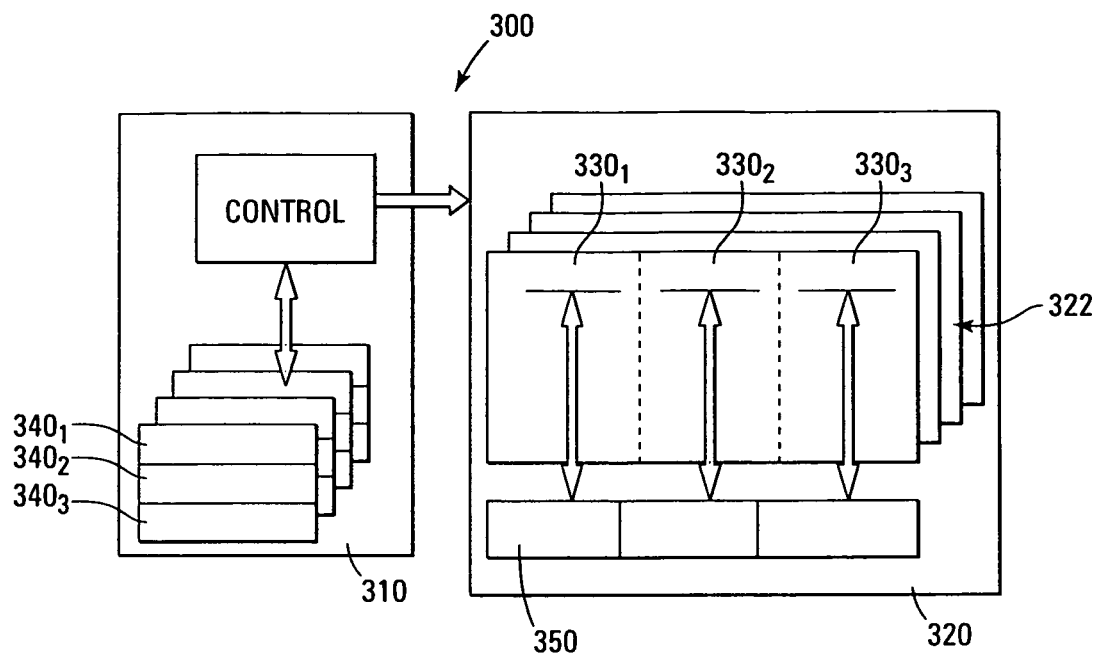
FIG. 3 is a block diagram of a processing system of one embodiment of the present invention.

Referring to FIG. 3, a block diagram of a processing system 300 of an embodiment of the present invention is described. The system includes a processor/chip set 310 that is coupled to a memory device 320. The memory device includes an array of memory cells 322 arranged in a plurality of banks. Each of the banks includes multiple addressable pages $330_1$-$330_3$. For example, the illustrated memory has four banks that are each divided to provide three addressable pages. Data from the pages are stored in corresponding latch circuitry 350 during an access operation. The data can then be output from the latches during a read operation. It will be appreciated by those skilled in the art that the number of pages per bank are not limited to the three page per bank illustration. This embodiment requires twelve open page registers be included with the chip set 310, a requirement that can result in a significant increase in the chip set size and cost.

Figure 4:
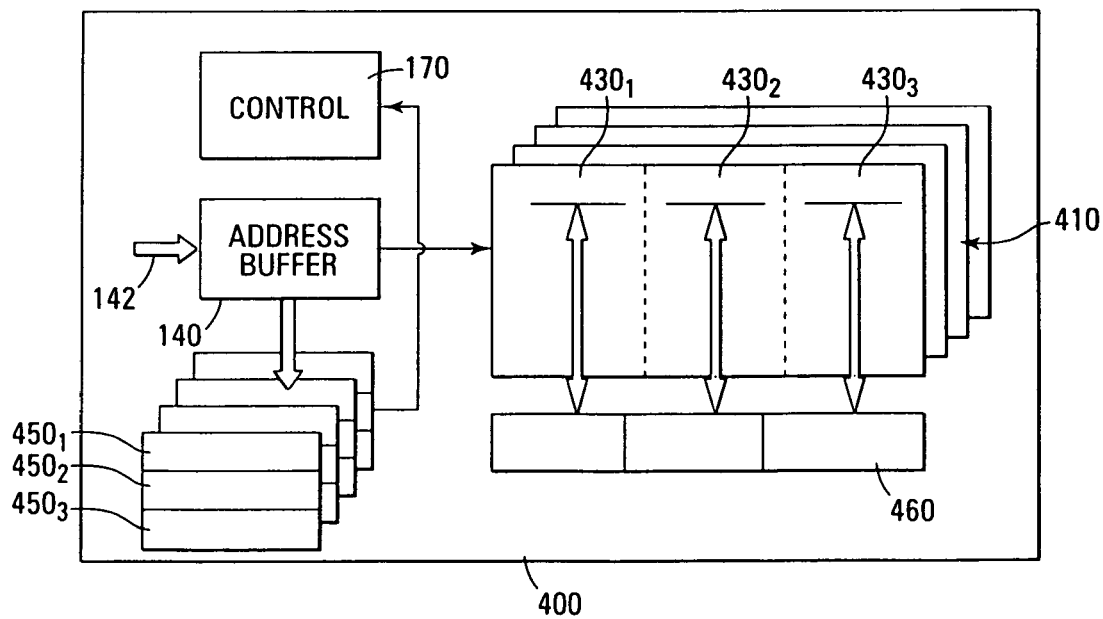
FIG. 4 is a block diagram of a memory device of another embodiment of the present system.

Referring to FIG. 4, a block diagram of a memory 400 of another embodiment of the present invention is described. The memory device includes an array of memory cells 410 arranged in a plurality of banks. Each of the banks includes multiple addressable pages $430_1$-$430_3$. The memory includes open page registers $450_1$-$450_3$ to track all open pages of the memory. As such, the memory compares an open page request of an active command (from processor 110 of FIG. 1 or chip set 310 of FIG. 3) with the content of the open page registers. It will be appreciated that the buffer circuit 140 of FIG. 4 can include row decoder 144, but it is not illustrated for simplicity. If the memory determines that the page requested is already available for a read operation, it ignores the access command (also known as an active command). The chipset assumes that the active cycle was executed by the memory and reads the data from latches 460 at an appropriate time during a read operation. This saves a lot of power for the system but does not give them the extra bandwidth that could be obtained if the chipset kept track of all the open pages as well. This internal page mode detection would save a lot of power without the external circuitry being aware of the pattern of data being requested from the memory. In cases where the memory has a lot of open pages and the nature of access to the memory is predictable, then there could be substantial power saving that would show up as longer battery life.

Figure 5:
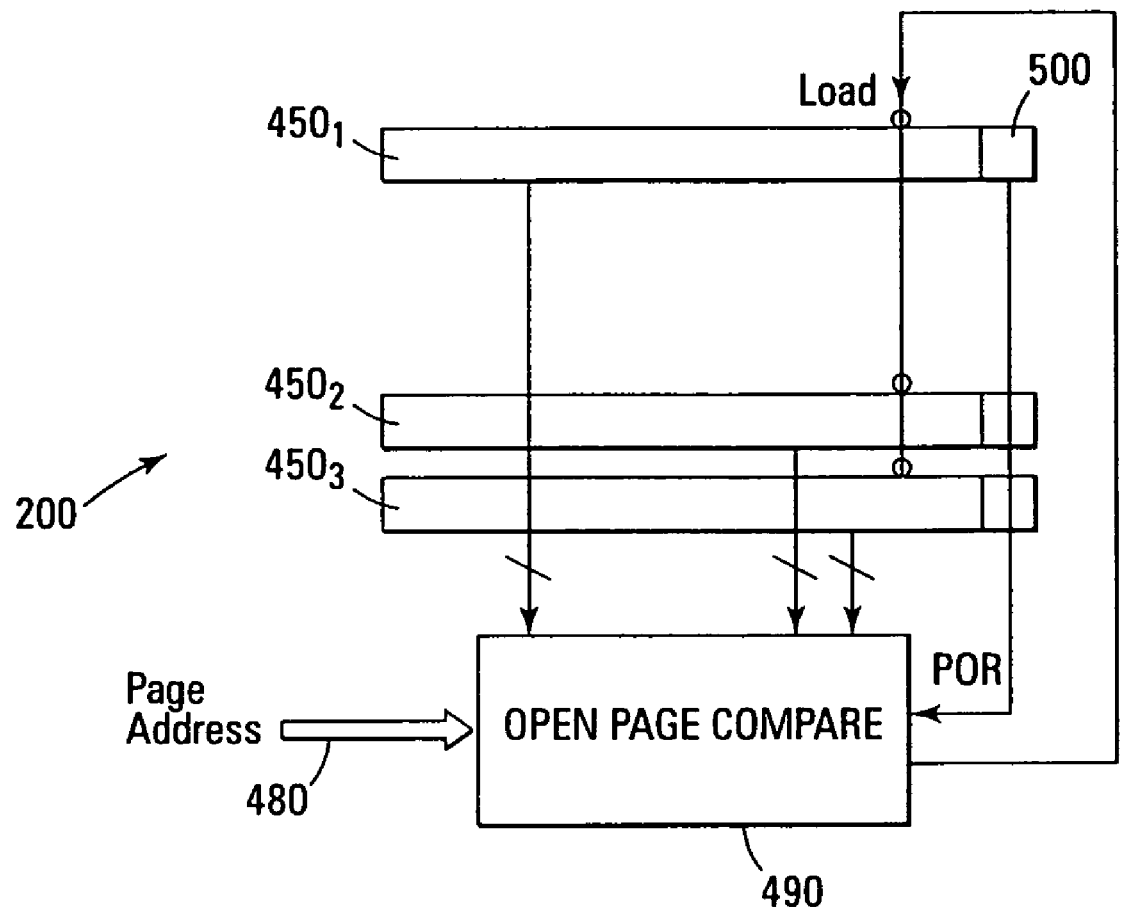
FIG. 5 illustrates one embodiment of open page register circuitry of the present invention.

FIG. 5 is a simplified illustration of one embodiment of open page register circuitry 200 of the present invention. The register circuitry includes a number of address registers $450_1$-$450_3$ that store an origination address of a page of the memory. As explained above, the array includes X blocks that are each divided into Y pages. In one embodiment, the page register circuitry comprises X*Y registers. An open page compare register is provided to compare a page request address with the contents of the registers. In operation, page address 480 provided with a read request is compared to the contents of a register corresponding to a page section of the corresponding memory array block. Alternatively, all register of the array block can be compared to the received page address. Open page compare circuit 490 can be included in control circuitry 170 (FIGS. 1 and 4).

Following a power-up or reset condition, the contents of the registers may be invalid. As such, a power-on-reset (POR) bit 500 is provided in the registers to inform the compare circuitry 490 to skip the comparison and load the requested page address 480 into the register. That is, the current page address is loaded into the corresponding register and the POR bit 500 is reset for future comparison operations.

Figure 6:
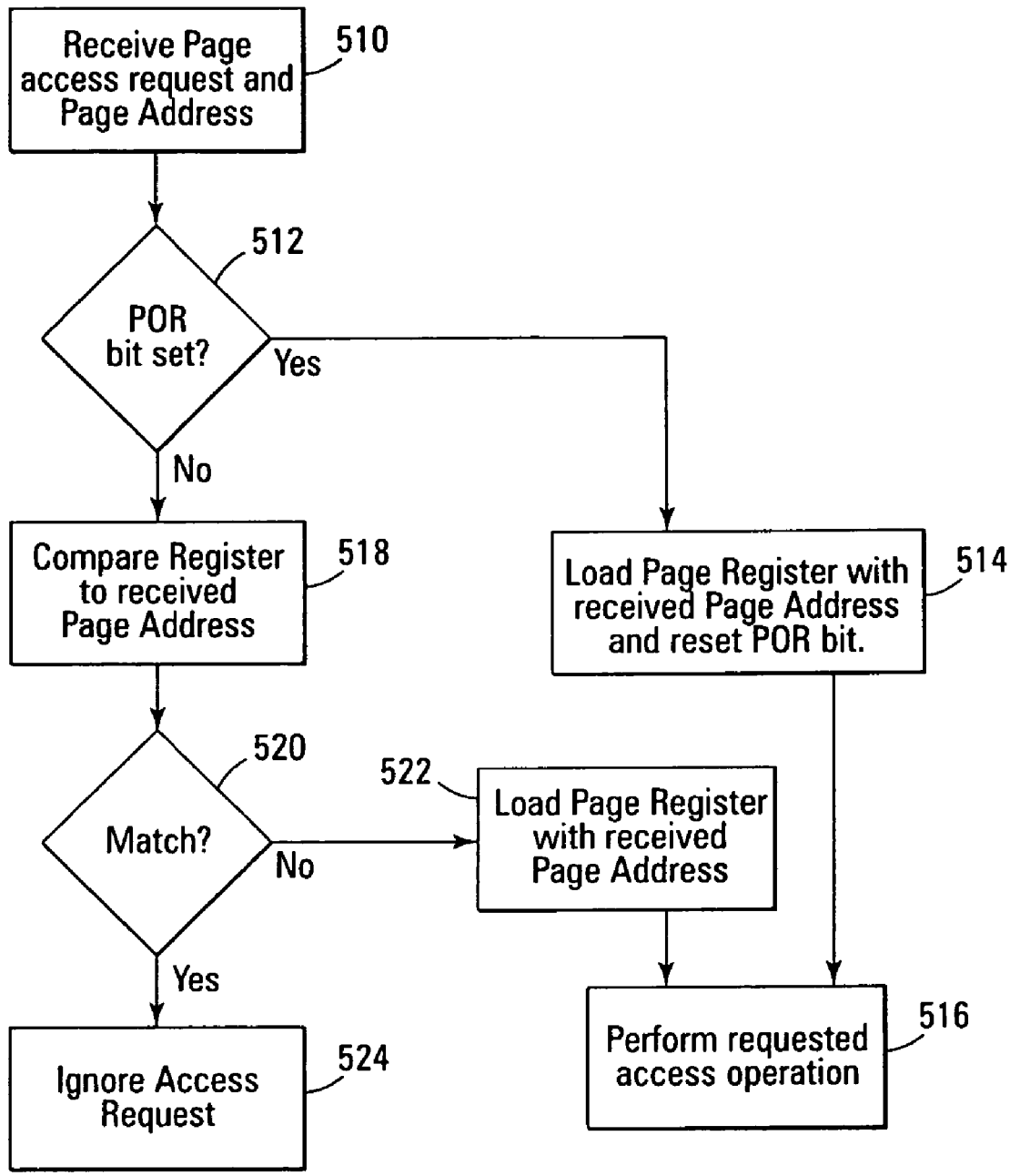
FIG. 6 is a flow chart of a method of one embodiment of the present invention.

FIG. 6 is a flow chart of one method of one embodiment of the present invention. An externally provided access command is received by the memory (510). If the POR bit of the page register is set (512), the page address is loaded into the register, and the POR bit is reset (514). The memory then executes the access operation by reading the page and copying the read data to latch circuitry (516). The latch circuitry 460 is then subsequently read during a read operation.

If the POR bit is reset (512), the contents of the page register are compared to the page address provided with the read command (518). If the page register contents do not match the requested page address (520), the page address is loaded into the register (522), and the memory executes the requested access operation (516). If the page register contents match the requested page address (520), the memory ignores the requested access operation because the contents of the latch circuitry already contains the data stored in the requested page location (524).

CONCLUSION

A memory device has been described that includes memory cells arranged in multiple blocks. A register is provided to track multiple open pages per block of the memory. In one embodiment, the register is located in the memory device and used to determine if a memory access is to be performed. In another embodiment, the register is located external to the memory and used by a processor and/or chip set to determine if an access request is needed.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A synchronous memory device comprising:
   an array of memory cells arranged in addressable blocks, wherein each addressable block is adapted to allow two or more pages of memory cells to be open for access at one time; and
   a means for storing address locations of the two or more open pages that are currently active for access per addressable block.

2. The synchronous memory device of claim 1 further comprises a means for comparing an access request address with contents of the means for storing address locations of the two or more open pages that are currently active for access per addressable block.

3. The synchronous memory device of claim 1 wherein the array of memory cells comprise an array of memory cells, each memory cell having a means for non-volatile data storage.

4. A synchronous memory system comprising:
   one or more synchronous memory devices, at least one synchronous memory device having an array of memory cells arranged in addressable blocks, wherein each addressable block is adapted to allow two or more pages of memory cells to be open for access simultaneously;
   one of a processor and a chip set coupled to communicate with the synchronous memory device; and
   a means for storing address locations of the two or more open pages that are currently active for access per addressable block of the synchronous memory device.

5. The synchronous memory system of claim 4 further comprising a means for comparing a requested memory address with contents of the means for storing address locations to determine if a memory access operation is needed.

6. The synchronous memory system of claim 4 wherein the means for storing address locations of the two or more open pages that are currently active for access per addressable block of the synchronous memory device is located within the synchronous memory device.

7. The synchronous memory system of claim 6 wherein the synchronous memory device compares an address provided by the one of a processor and a chipset to contents of the means for storing address locations in response to an access request to determine if the access request is performed.

8. A synchronous memory system comprising:
   one or more synchronous memory devices, at least one synchronous memory device having:
      an array of memory cells arranged in X addressable blocks, each of the X addressable blocks is divided into Y sections, wherein X and Y are integers and where each section of the Y sections of each block is adapted to allow a page of memory from the section to be selected and opened for access, and
      latch circuitry corresponding to each of the X addressable blocks to store data from the selected page from each of the Y sections read from the array;
   one of a processor and a chip set coupled to communicate with the at least one synchronous memory device; and
   a page register circuit comprising at least X*Y number of active page registers to store origination addresses of currently opened pages of each of the Y sections per X addressable blocks of the at least one synchronous memory device.

9. The synchronous memory system of claim 8 further comprising an address comparator that is adapted to compare an access request address to the at least one synchronous memory device with the origination addresses stored in the at least X*Y number of registers.

10. The synchronous memory system of claim 9 wherein the memory system is adapted to skip opening a page associated with the access request address when a matching origination address is present in the at least X*Y number of registers, and where the memory system is adapted to open the page associated the access request address when no matching origination address is present in the at least X*Y number of registers.

11. The synchronous memory system of claim 10 further comprising at least X*Y number of power-on-reset (POR) indicator bits, wherein a POR bit of the at least X*Y number of POR bits is associated with each register of the at least X*Y number of registers and, where the memory system is adapted to set the at least X*Y number of POR bits in response to occurrence of a power-up or a reset.

12. The synchronous memory system of claim 11 wherein the memory system is adapted to open the page associated the access request address in the at least one synchronous memory device when a matching origination address is present in a register of the at least X*Y number of registers and the associated POR bit of the register is set, and, after opening the page associated with the access request address, the memory system is adapted to load the register with the origination address of the open page and reset the associated POR bit.

13. The synchronous memory system of claim 11 wherein the memory system is adapted to open the page associated the access request address in the at least one synchronous memory device when an associated POR bit of a register that is associated with an address range of the access request address is set, and, after opening the page associated with the access request address, the memory system is adapted to load the register with the origination address of the open page and reset the associated POR bit.

14. The synchronous memory system of claim 8 wherein the page register circuit is located within the at least one synchronous memory device.

15. The synchronous memory system of claim 8 wherein the one of a processor and a chip set is adapted to skip issuing an ACTIVE command when a page associated with an access request address is matched in the at least X*Y number of registers.

16. A method of operating a memory system comprising:
comparing a corresponding page address of a memory page access request with contents of an active page register, wherein the active page register stores the address of a currently opened memory page of a memory device of a memory system, where the memory system contains one of a processor and chip set coupled to one or more memory devices, and where the memory device is arranged in addressable blocks and the active page register stores the address locations of two or more open pages per addressable block; and
ignoring the memory page access request when the corresponding page address is matched with an address location stored in the active page register.

17. The method of claim 16 further comprising opening the corresponding page address and loading an address location of the opened page into the page register when the corresponding page address is not matched with an address location stored in the active page register.

18. The method of claim 16 wherein comparing a corresponding page address of a memory page access request with contents of an active page register and ignoring the memory page access request when the corresponding page address is matched with an address location stored in the active page register further comprises evaluating a reset bit associated with the active page register and, when the reset bit is set, opening the corresponding page address, loading an address location of the opened page into the page register, and clearing the reset bit.

19. The method of claim 16 further comprising setting two or more reset bits associated with the address locations of two or more open pages per addressable block of the active page register on the occurrence of a power-up or reset.

20. The method of claim 16 wherein the memory device is a synchronous memory device.

21. The method of claim 16 wherein the memory device is a non-volatile memory device.

22. The method of claim 16 wherein the active page register is located within the memory device.

23. A method of operating a memory device comprising:
receiving a memory page access request and corresponding page address;
comparing a corresponding page address of a memory page access request with contents of an active page register, wherein the active page register stores the address of a currently opened memory page of the memory device, where the memory device is arranged in addressable blocks and the active page register stores the address locations of two or more open pages per addressable block; and
ignoring the memory page access request when the corresponding page address is matched with an address location stored in the active page register.

24. The method of claim 23 further comprising opening the corresponding page address and loading an address location of the opened page into the page register when the corresponding page address is not matched with an address location stored in the active page register.

25. The method of claim 23 wherein comparing a corresponding page address of a memory page access request with contents of an active page register and ignoring the memory page access request when the corresponding page address is matched with an address location stored in the active page register further comprises evaluating a reset bit associated with the active page register and, when the reset bit is set, opening the corresponding page address, loading an address location of the opened page into the page register, and clearing the reset bit.

26. The method of claim 23 further comprising setting two or more reset bits associated with the address locations of two or more open pages per addressable block of the active page register on the occurrence of a power-up or reset.

27. The method of claim 23 wherein the memory device is a synchronous memory device.

28. The method of claim 23 wherein the memory device is a non-volatile memory device.

29. A method of improving read efficiency of a processing system comprising:
comparing a corresponding page address of a memory page access request with contents of an active page register, wherein the active page register stores the address of a currently opened memory page of a memory device of a processing system, where the memory device is coupled to a one of a processor and a chip set, and where the memory device is arranged in addressable blocks and the active page register stores the address locations of two or more open pages per addressable block; and ignoring the memory page access request when the corresponding page address is matched with an address location stored in the active page register.

30. The method of claim 29 further comprising opening the corresponding page address and loading an address location of the opened page into the page register when the corresponding page address is not matched with an address location stored in the active page register.

31. A method of reducing power consumption in a memory device comprising:

receiving a memory page access request and corresponding page address;

comparing a corresponding page address of a memory page access request with contents of an open page register, wherein the open page register stores the address of a currently opened memory page of the memory device, where the memory device is arranged in addressable banks and the open page register stores the address locations of two or more open pages per bank; and ignoring the memory page access request when the corresponding page address is matched with an address location stored in the open page register.

32. The method of claim 31 further comprising opening the corresponding page address and loading an address location of the opened page into the page registe whenr the corresponding page address is not matched with an address location stored in the open page register.

* * * * *

UNITED STATES PATENT AND TRADEMARK OFFICE
CERTIFICATE OF CORRECTION

| | |
|---|---|
| PATENT NO. | : 7,269,686 B2 |
| APPLICATION NO. | : 11/302056 |
| DATED | : September 11, 2007 |
| INVENTOR(S) | : Roohparvar |

It is certified that error appears in the above-identified patent and that said Letters Patent is hereby corrected as shown below:

In column 7, line 57, in Claim 16, after "processor and" insert -- a --.

In column 8, line 67, in Claim 29, after "coupled to" delete "a".

In column 10, line 14, in Claim 32, delete "registe whenr" and insert -- register when --, therefor.

Signed and Sealed this

Twentieth Day of November, 2007

JON W. DUDAS
*Director of the United States Patent and Trademark Office*